(12) United States Patent
Edelstein (10) Patent No.: US 6,947,319 B1
(45) Date of Patent: Sep. 20, 2005

(54) INCREASED SENSITIVITY IN LOCAL PROBE OF MAGNETIC PROPERTIES

(75) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/880,276

(22) Filed: Jun. 30, 2004

Related U.S. Application Data (63) Continuation-in-part of application No. 10/434,337, filed on May 9, 2003, now Pat. No. 6,762,954.

(51) Int. Cl.[7] .................................................. G11C 7/00
(52) U.S. Cl. ...................................... 365/173; 365/171
(58) Field of Search ............................... 365/173, 171, 365/158; 360/324.15; 324/252

(56) References Cited

U.S. PATENT DOCUMENTS

| | | | |
|---|---|---|---|
| 5,408,377 A | 4/1995 | Gurney et al. | |
| 5,764,567 A | 6/1998 | Parkin | |
| 6,072,382 A | 6/2000 | Daughton et al. | |
| 6,124,711 A * | 9/2000 | Tanaka et al. | 324/252 |
| 6,252,796 B1 * | 6/2001 | Lenssen et al. | 365/173 |
| 6,330,136 B1 | 12/2001 | Wang et al. | |
| 6,349,053 B1 | 2/2002 | Daughton et al. | |
| 6,381,171 B1 | 4/2002 | Inomata et al. | |
| 6,418,048 B1 | 7/2002 | Sin et al. | |
| 6,462,641 B1 | 10/2002 | Dieny et al. | |
| 2002/0008948 A1 | 1/2002 | Sasaki et al. | |
| 2002/0047145 A1 | 4/2002 | Nickel | |
| 2002/0068195 A1 | 6/2002 | Lundstrom | |

* cited by examiner

Primary Examiner—Vu A. Le
(74) Attorney, Agent, or Firm—Edward L. Stolarun

(57) ABSTRACT

An apparatus, system, and method for probing magnetic permeability of a material located a distance from the apparatus comprises a first hard ferromagnetic layer, a second hard ferromagnetic layer, a first soft ferromagnetic layer, a second soft ferromagnetic layer, an intermediate layer disposed between the first hard ferromagnetic layer and the first soft ferromagnetic layer, an insulating layer between the first soft ferromagnetic layer and second soft ferromagnetic layer, and a spacer layer disposed between the second soft ferromagnetic layer and the second hard ferromagnetic layer, wherein the second soft ferromagnetic layer increases an on/off ratio of a magnetic field in the first soft ferromagnetic layer, wherein the on/off ratio is approximately 1.6, and wherein the second soft ferromagnetic layer pulls a magnetic field of the apparatus into the first soft ferromagnetic layer.

42 Claims, 4 Drawing Sheets

INCREASED SENSITIVITY IN LOCAL PROBE OF MAGNETIC PROPERTIES

CROSS-REFERENCE TO RELATED APPLICATION

This application is a continuation-in-part of prior U.S. patent application Ser. No. 10/434,337, filed May 9, 2003 U.S. Pat. No. 6,762,954, and entitled "Local Probe of Magnetic Properties," the complete disclosure of which is herein incorporated by reference.

GOVERNMENT INTEREST

The invention described herein may be manufactured, used, and/or licensed by or for the United States Government for Governmental purposes without the payment of any royalties.

BACKGROUND OF THE INVENTION

1. Field of the Invention

The invention generally relates to magnetic sensor methods and systems, and more particularly to probing devices associated with magnetic sensors and spin-dependent tunneling (SDT) sensors.

2. Description of the Related Art

Magnetic films are used in a variety of devices that include magnetic random access memories MRAM and magnetic recording media. In the magnetic recording industry, information is generally stored as magnetic bits on thin ferromagnetic films. In reading such magnetic bits, the magnetic recording industry requires detection devices that measure the magnetization of small regions along a magnetic track. Computer storage devices, such as, for example, magnetic disk drives, utilize read/write heads to store and retrieve data. A write head stores data by utilizing magnetic flux to set the magnetic moment of a particular area on a magnetic media. The state of the magnetic moment is later read by a read head, which senses the magnetic fields.

Presently, quality read heads utilize giant magnetoresistance (GMR) read heads, which are spin valves or similar to spin valves. Such GMR thin-film read heads employ magnetoresistive material, generally formed in a layered structure of ferromagnetic magnetoresistive and non-ferromagnetic non-magnetoresistive materials, to detect the magnetic moments of the data bits on the media. A sensing current is passed through the magnetoresistive material to detect changes in the resistance of the material induced by the data bits as they pass the read head. Spin valves are usually formed as three layer structures including a hard or pinned ferromagnet, a soft ferromagnet, and a thin intervening conductor. Another device for measuring local magnetizations is a magnetic force microscope. Magnetic force microscopes are scanning tunneling microscopes with ferromagnetic tips.

The magnetoresistivity of GMR devices depends on the ease with which electrons can make transitions between the soft and hard ferromagnetic materials. Electrons traveling along the layers without making this transition do not contribute to the magnetoresistance. Thus, the layers in a GMR device must be thin in order for a signal generated by a field change not to be too small. Another type of magnetic sensor is a spin dependent tunneling SDT sensor. An SDT sensor consists of a hard ferromagnetic layer, a soft ferromagnetic layer, and a thin insulating intervening layer. The tunneling impedance between the two ferromagnets is less when the magnetizations of the two ferromagnets are parallel. An example of a GMR sensor is the GMR sensor disclosed in the above-mentioned U.S. patent application Ser. No. 10/434,337. Recent magnetic modeling calculations with a single thin layer, have achieved less than optimum results because if the sense layer is very thin, it will not affect the magnetic field flux lines. The ratio of the field in the sense material when it was over a soft magnetic material to the field to when it was not over the soft magnetic material was found to be approximately only 1.14. This small field change makes it difficult to read magnetic information.

Other conventional methods for measuring local magnetization such as magnetic force microscopes and electron microscopes with magnetic electrodes that analyze the spin direction of tunneling electrons can be cumbersome, inefficient, and expensive.

Therefore, while the above-referenced U.S. patent application discloses embodiments that were satisfactory for the purposes for which they were intended, there remains a need for improved systems and methods for probing the magnetic properties of materials. In particular, a need exists for improved methods and systems for measuring the extent to which a local surface region of a material can be magnetized. Conventional magnetic sensing systems and methods are limited because most other magnetic probes do not measure how easily a material may be magnetized. Furthermore, most other conventional devices do not readily permit varying the length over which the material's magnetic properties are being probed. Thus, there is a need to overcome the limitations of the conventional systems and methods and to effectively probe the magnetic properties of a particular material.

SUMMARY OF INVENTION

In view of the foregoing, an embodiment of the invention provides an apparatus, system, and method for probing the magnetic permeability of a material comprising a sensor unit that comprises a plurality of magnetic layers thereof, including a first soft ferromagnetic layer, a second soft ferromagnetic layer, a first hard ferromagnetic layer and a second hard ferromagnetic layer; an intermediate layer separating the first hard ferromagnetic layer from the first soft ferromagnetic layer; an insulating layer separating the first soft ferromagnetic layer from second soft ferromagnetic layer; and a spacer layer separating the second soft ferromagnetic layer from the second hard ferromagnetic layer, wherein the second soft ferromagnetic layer is dimensioned and configured to have a thickness greater than the first soft ferromagnetic layer, and wherein the sensor unit measures the magnetic permeability of a material located a distance from the sensor unit through the magnetic interaction of the magnetic layers of the sensor unit. The first ferromagnetic layer may be an effective hard ferromagnetic layer that is a bilayer comprising a ferromagnet and a pinning layer such as an antiferromagnet.

In one embodiment, the first soft ferromagnetic layer and the second soft ferromagnetic layer may comprise a same material. While in another embodiment, the materials may be different. Moreover, the second soft ferromagnetic layer increases an on/off ratio of a magnetic field in the first soft ferromagnetic layer, wherein the on/off ratio is approximately 1.6. Additionally, the second soft ferromagnetic layer pulls a magnetic field of the system into the first soft ferromagnetic layer. The intermediate layer comprises an insulator or a conductor. In one embodiment, the conduction between the first hard ferromagnetic layer and the first soft ferromagnetic layer occurs via tunneling. In this embodiment the layer, separating the first hard ferromagnetic layer and the first soft ferromagnetic layer is an insulator. In another embodiment, the conduction between the first hard ferromagnetic layer and the first soft ferromagnetic layer occurs via in-plane conduction. In this case, the layer separating the first hard ferromagnetic layer and the first soft ferromagnetic layer is a non-ferromagnetic conductor such as silver or copper.

Furthermore, the thickness of the second hard ferromagnetic layer is greater than the thicknesses of the intermediate layer, the first hard ferromagnetic layer, and the first soft ferromagnetic layer. Moreover, a magnetic interaction occurs between the second hard ferromagnetic layer and the second soft ferromagnetic layer, if the thickness of the spacer layer is comparable to the thicknesses of the second hard ferromagnetic layer and the second soft ferromagnetic layer. A change in magnetization of the first soft ferromagnetic results in a change in the impedance between the first hard ferromagnetic layer and the first soft ferromagnetic layer if the separating layer is an insulator. Alternatively, the change in magnetization of the first soft ferromagnetic layer and the second soft ferromagnetic layer results in a change in in-plane conduction thereof if the separating layer is a conductor. Also, the sensor unit is moveable in at least one direction proximate to the material for probing the magnetic permeability thereof, wherein a length L of the first hard ferromagnetic layer, the second hard ferromagnetic layer, the first soft ferromagnetic layer, the second soft ferromagnetic layer, the intermediate layer, the insulating layer, and the spacer layer is greater than the lateral dimension of the material to be investigated that is located the distance from the sensor unit, and wherein the length L is approximately 10 to 100 microns.

Several advantages are afforded by varying embodiments of the invention. The device described herein, including systems and methods thereof, can be adapted to probe the magnetic permeability of magnetic surface layers that include magnetic recording media. The length over which one probes the material utilizing the sensor unit described herein can be varied. Moreover, adding a bridging ferromagnetic layer can increase the sensitivity of the device.

Because the device described herein can be implemented as a miniature magnetic sensor a number of applications are available for sensing the local magnetic permeability in a variety of materials, wherein the invention lends itself to a variety of uses including industrial, biomedical, oceanographic, environmental, military, and space related applications, to name a few. For example, the local probe of magnetic properties provided by the invention can be used to read non-erasable magnetic media on credit cards, ID tags, etc. The trend in magnetic sensor design and development is constantly evolving toward smaller size, lower power consumption and lower cost for similar performance. Thus, the device described herein, including systems and methods thereof, is ideally suited for use with magnetic sensing applications, including MEMS-type components. Essentially, the invention allows a more practical use of GMR and SDT sensors in a local probe of magnetic properties.

These and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

The invention will be better understood from the following detailed description of the preferred embodiments of the invention with reference to the drawings, in which.

DETAILED DESCRIPTION OF PREFERRED EMBODIMENTS OF THE INVENTION

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for improvements to the conventional devices for probing the magnetic properties of a particular material. The invention achieves this by changing the electrical impedance in the sense layer of a magnetic sensor unit. Referring now to the drawings, and more particularly to FIGS. 1 through 6, there are shown preferred embodiments of the invention. In the above-referenced parent application, the sense layer comprises a single layer of a soft ferromagnetic material. According to the novel design of the invention the single layer is replaced by two layers separated by a thin insulating layer. Replacing the single soft ferromagnetic layer with a double layer, one thin soft ferromagnetic layer and another thicker soft ferromagnetic layer assists in pulling the magnetic flux lines to the thin soft ferromagnetic layer. Doing this increases the on/off ratio of the magnetic field in the thin sense strip to a much higher value of approximately 1.6.

Figure 1:
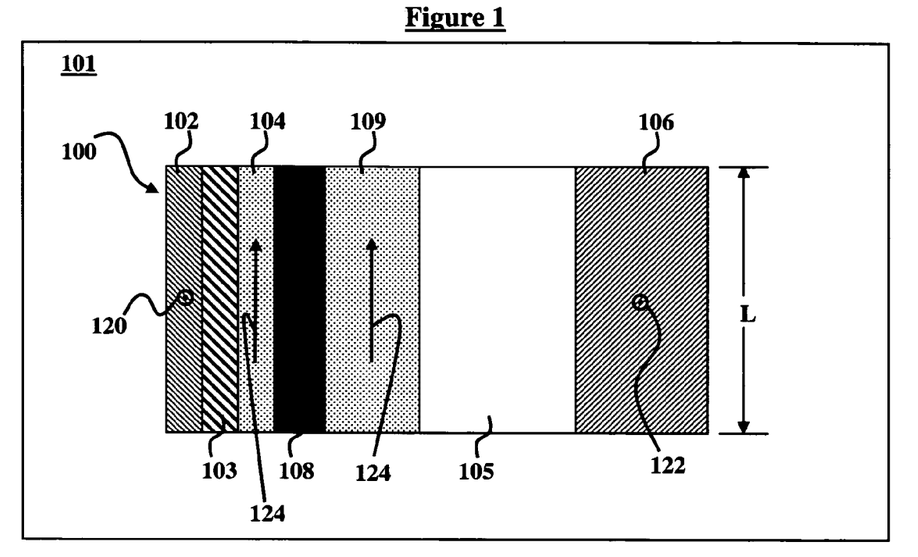
FIG. 1 illustrates a top view of a sensor, which can be implemented in accordance with a preferred embodiment of the invention.

FIG. 1 illustrates a top view of a sensor unit 100, which can be implemented in accordance with a preferred embodiment of the invention. The arrows generally indicate the directions of the magnetization. The direction of the magnetization of the first soft ferromagnetic layer 104 and the second soft ferromagnetic layer 109 can change when the sensor unit 100 is brought near a magnetic material 101.

Figure 2:
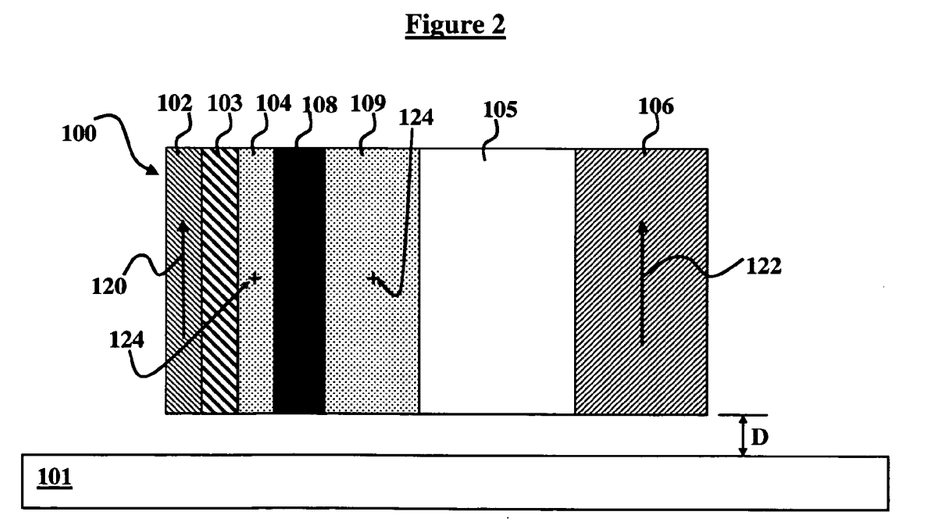
FIG. 2 depicts a side view of the sensor unit illustrated in FIG. 1, in accordance with a preferred embodiment of the invention.

FIG. 2 depicts a side view of the sensor unit 100 illustrated in FIG. 1, in accordance with a preferred embodiment of the invention. Sensor unit 100 can be, for example, a spin dependent tunneling SDT sensor or a spin valve. Note that SDT sensors and spin valves are well known in the art and thus a detailed explanation of how a typical SDT sensor functions is not necessary for purposes of describing the invention disclosed herein.

As indicated in FIGS. 1 and 2, sensor unit 100 can be located a distance D from a material 101 being probed by the sensor unit 100. Sensor unit 100 includes a hard magnet 102, which is located proximate to an intermediate layer 103 that can be configured as a tunnel barrier or a conductor that comprises a spin valve. The first hard magnet 102 generally comprises a hard ferromagnetic layer. Additionally, the first hard magnet 102 may be a bilayer comprised of a ferromagnet and a pinning layer that may be an antiferromagnet. If a bilayer is used, the ferromagnet should preferably be adjacent to the intermediate layer 103. The embodiment of the bilayer was not included in the figures in order for ease of understanding and to not complicate the figures.

The soft magnet is sectioned into the first soft ferromagnetic layer 104 and the second soft ferromagnetic layer 109, separated by the thin insulating layer 108, wherein the first soft ferromagnetic layer 104 is located between the intermediate layer 103 and the insulating layer 108, and the second soft ferromagnetic layer 109 is located between the insulating layer 108 and the spacer layer 105. The second hard magnet 106 can be located proximate to spacer layer 105. The second hard magnet 106 also comprises a hard ferromagnetic layer. The first and second soft ferromagnetic layers 104, 109 may comprise the same material such as permalloy. The magnetic permeability for the soft magnetic layers 104, 109 vary from several thousand for permalloy and amorphous Fe alloys to near to $1 \times 10^5$ for Co-based amorphous alloys and Finemet®, available from Hitachi Metals, Ltd. Corporation, Tokyo, Japan. Finemet® is an ultrafine grained alloy of Fe, Si, B, Cu, and Nb. In general, the arrows 120, 122, and 124 in the illustrated embodiments of FIGS. 1 to 4 indicate how the magnetizations of the ferromagnetic materials may be directed before the sensor unit 100 senses the magnetic properties of the material to be probed. The insulating layer 108 can be made from a variety of materials that include $Al_2O_3$ and $SiO_2$.

Figure 3:
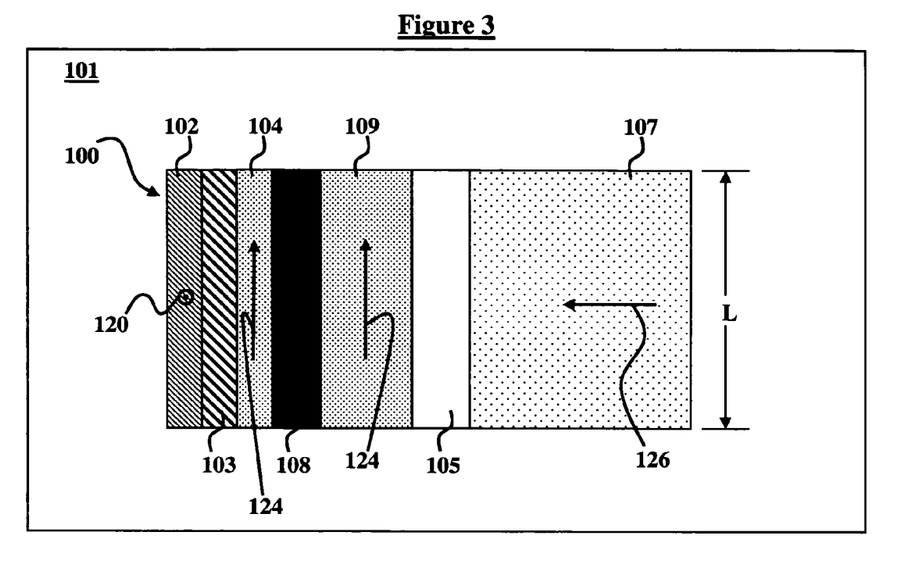
FIG. 3 illustrates a top view of a sensor, which can be implemented in accordance with an alternative embodiment of the invention.
Figure 4:
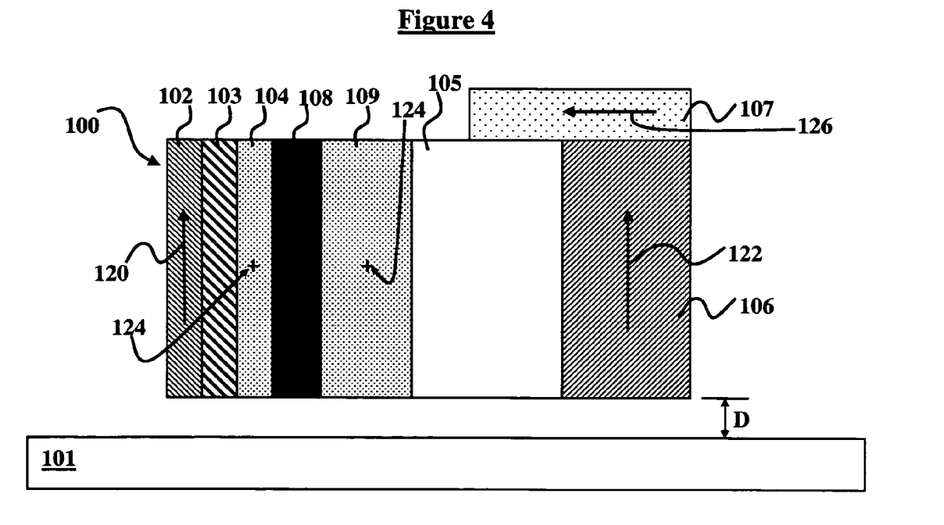
FIG. 4 depicts a side view of the sensor unit illustrated in FIG. 3, in accordance with an alternative embodiment of the invention.

FIGS. 3 and 4 illustrate alternative embodiments of the invention in which an additional bridging ferromagnet 107 can be added to facilitate magnetic flux lines traveling through the first and second soft ferromagnetic layer 104, 109 when the sensor unit 100 is brought close to magnetic material 101. This will increase the response of the sensor 100. FIG. 3 thus illustrates a top view of a sensor unit 100, which can be implemented in accordance with an alternative embodiment of the invention. FIG. 4 depicts a side view of the sensor unit 100 illustrated in FIG. 3, in accordance with an alternative embodiment of the invention.

If intermediate layer 103 constitutes an insulator, then conduction occurs between the first hard ferromagnetic layer 102 and the first soft ferromagnetic layer 104 via tunneling. The tunneling impedance depends on the magnetization direction of the soft magnetic material, which comprises soft magnet layer 104. If the magnetization of the first soft ferromagnetic layer 104 is parallel to the magnetization of the hard magnet 102, then the impedance thereof comprises minimum impedance. If intermediate layer 103 is a conductor, then conduction occurs in the plane of the layers 102, 103, and 104. If the magnetization of the soft ferromagnetic layer 104 is parallel to the magnetization of the hard magnet 102, then the impedance in the plane conduction can comprise minimum impedance.

The thickness of spacer layer 105 and hard magnet 106 (i.e., second hard ferromagnetic layer) is generally greater than the thickness of intermediate layer 103 (i.e., wherein layer 103 can be an insulator or a conductor) and hard magnet 102 (i.e., a hard ferromagnetic layer), respectively. When the distance D indicated is comparable to the thickness of the spacer layer 105, there will be a magnetic interaction between the hard magnet 106 and the first and second soft ferromagnetic layers 104, 109 that can change the direction of magnetization of soft ferromagnets 104, 109. The amount of change thereof depends generally on the properties of the magnetic material 101 beneath spacer layer 105. Specifically, the amount of change depends on the magnetic permeability of the magnetic material 101.

If the magnetic material 101 has a large permeability and the distance D is small, then there is an easy flux path connecting the magnets 104, 109, and 106. The result of this is if the magnetization of the magnet 106 is directed up (or down), then the magnetization of magnets 104, 109 will tend to be directed down (or up). If the magnetization of the magnet 102 is up, this will tend to increase (or decrease) the tunneling impedance between hard magnet 102 and soft magnet 104. By translating the sensor unit 100, which is configured to include first hard magnet 102, intermediate layer 103, first soft magnet 104, insulating layer 108, second soft magnet 109, spacer layer 105, and second hard magnet 106, and possibly the bridging ferromagnet 107 one can probe the permeability of material 101 at different locations along its surface. The magnetic field direction of ferromagnet 107 is generally indicated in FIGS. 3 and 4 by arrow 126. The length over which one probes this property of material 101 is approximately the thickness of spacer layer 105.

Alternatively, by translating the sensor unit 100 that comprises hard magnet 102, intermediate layer 103, first soft magnet 104, insulating layer 108, and second soft magnet 109, one can thus probe the magnetic permeability of material 101 at different locations along its surface. The length over which one probes such properties of material 101 is approximately the thickness of the intermediate layer 103 plus the thickness of the insulating layer 108 (e.g., an insulator or insulating layer). An example of such a length is 1–20 nm.

Another alternative is to translate the sensor unit 100 that comprises hard magnet 102, intermediate layer 103, and first soft magnet 104 to probe the magnetic permeability of material 101 at different locations along its surface. The length over which one probes such properties of material 101 is approximately the thickness of the intermediate layer 103. An example of such a length is 1–2 nm.

Figure 5:
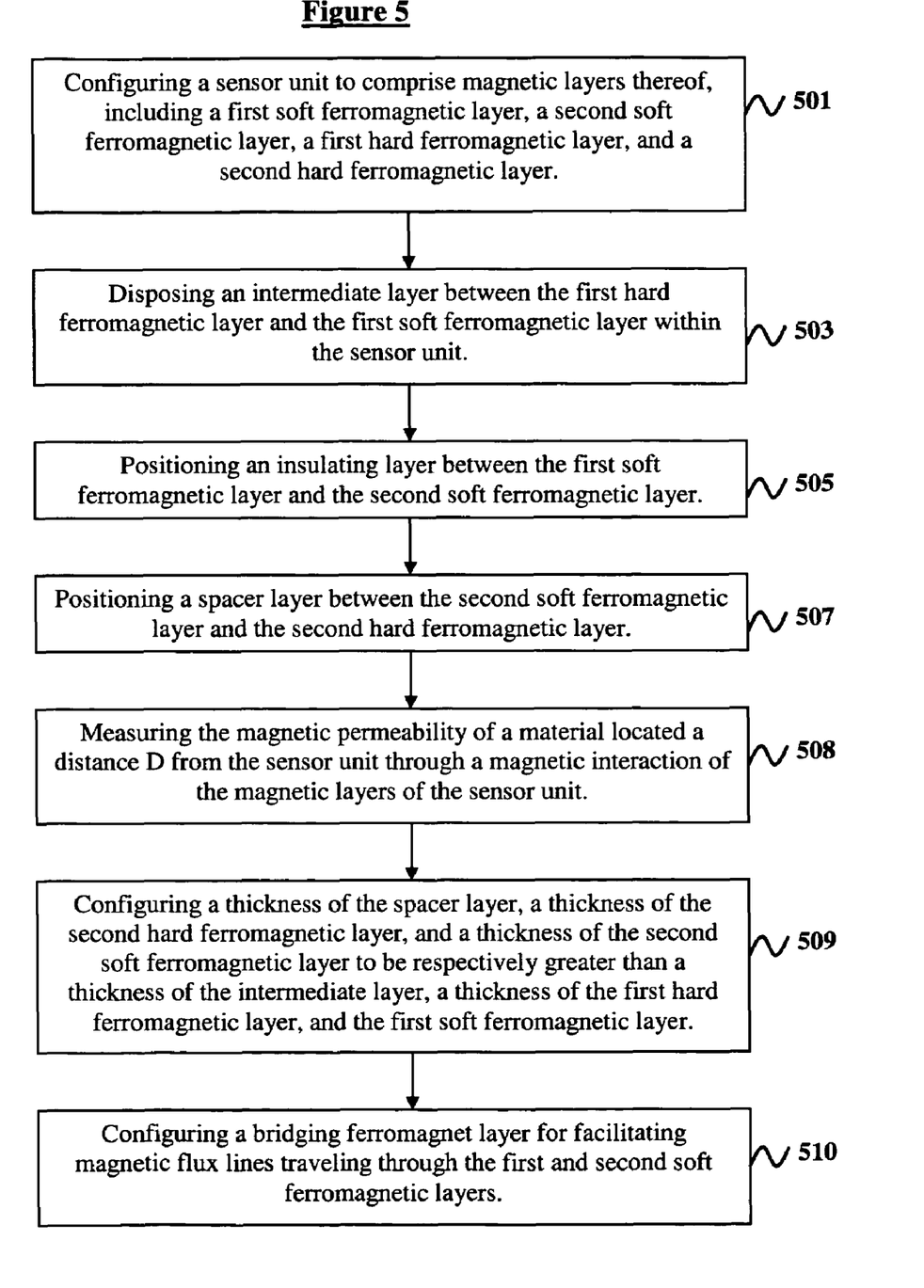
FIG. 5 is a flow diagram illustrating a preferred method of the invention.

FIG. 5 illustrates a flow diagram depicting logical operations, which may be implemented for configuring a sensor in accordance with a preferred embodiment of the invention. FIG. 5 thus generally illustrates a methodology for implementing a sensor for probing the magnetic permeability of a material 101, wherein the method comprises configuring 501 a sensor unit 100 to comprise magnetic layers thereof, including a first soft ferromagnetic layer 104, a second soft ferromagnetic layer 109, a first hard ferromagnetic layer 102, and a second hard ferromagnetic layer 106; disposing 503 an intermediate layer 103 between the first hard ferromagnetic layer 102 and the first soft ferromagnetic layer 104 within the sensor unit 100; positioning 505 an insulating layer 108 between the first soft ferromagnetic layer 104 and the second soft ferromagnetic layer 109; positioning 507 a spacer layer 105 between the second soft ferromagnetic layer 109 and the second hard ferromagnetic layer 106; and measuring 508 the magnetic permeability of a material 101 located a distance D from the sensor unit 100 through a magnetic interaction of the magnetic layers 102, 104, 106, 109 of the sensor unit 100, wherein the first soft ferromagnetic layer 104 and the second soft ferromagnetic layer 109 may comprise a same material, wherein the second soft ferromagnetic layer 109 increases an on/off ratio of a magnetic field in the first soft ferromagnetic layer 104, and wherein the on/off ratio is approximately 1.6.

Additionally, the method further comprises configuring 509 a thickness of the spacer layer 105, a thickness of the second hard ferromagnetic layer 106, and a thickness of the second soft ferromagnetic layer 109 to be respectively greater than a thickness of the intermediate layer 103, a thickness of the first hard ferromagnetic layer 102, and the first soft ferromagnetic layer 104. Moreover, the thickness of the insulating layer 108 is preferably comparable to the thickness of the first hard ferromagnetic layer 102 or less. Furthermore, the method comprises configuring 510 a bridging ferromagnetic layer 107 for facilitating magnetic flux lines traveling through the first and second soft ferromagnetic layers 104, 109.

Figure 6:
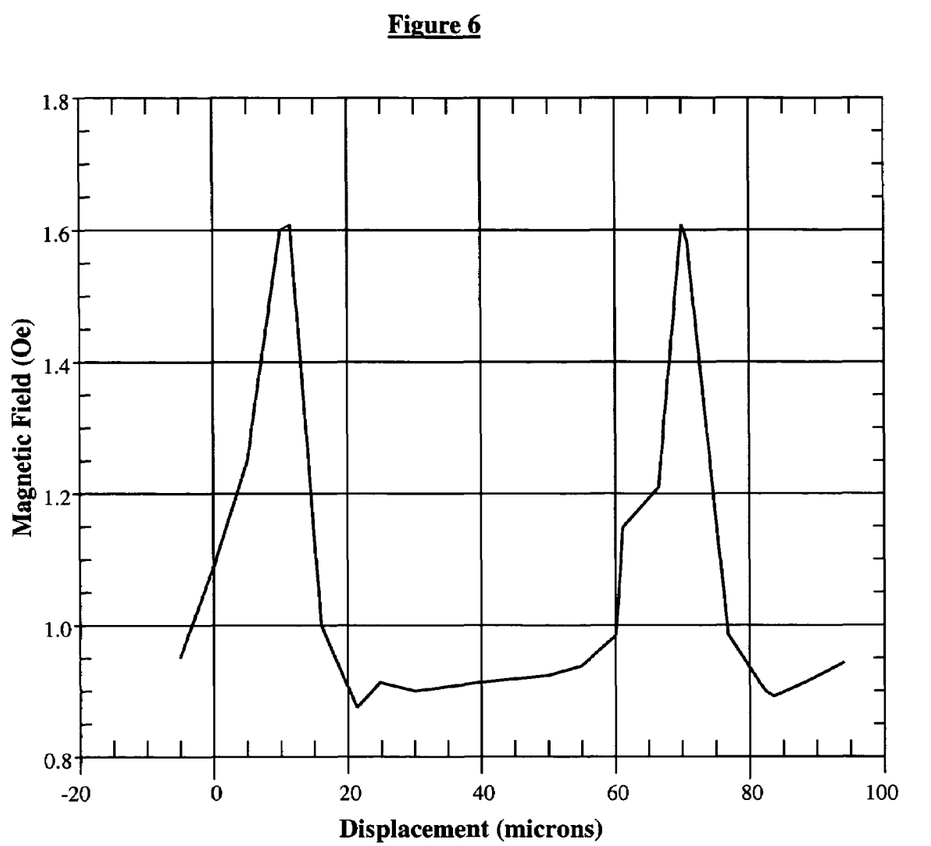
FIG. 6 is a graphical illustration demonstrating the results of a finite element modeling calculation based on an embodiment of the invention.

FIG. 6 illustrates the results of a magnetic modeling calculation performed using finite element analysis of the variation of the magnetic field in the first soft ferromagnet 104 as the device is scanned over the magnetic material 101 to be probed. The reader is 0.08 microns from the surface of the strips. In this case the material 101 comprises two soft ferromagnetic strips 11.041 microns wide, 0.5 microns thick, and 50 microns apart (right edge of left strip to left edge of right strip). The zero of the horizontal axis corresponds to the leading edge of the reader being lined up with the right side of the first strip. The vertical axis shows the induced magnetic field in Oe of the first soft ferromagnet 104 as a function of position. As shown, the ratio of field values when the sensor is over the magnetic strip to when it is not over the magnetic strip, which is denoted as the on/off ratio is increased to a high value of approximately 1.6.

This increase in the on/off ratio of the magnetic field in the sense material 104 is demonstrably higher than the on/off ratio values (1.14) achieved using the conventional designs. Moreover, this increase in the on/off ratio demonstrates how much easier it is to read magnetic information using the invention than by conventional approaches. The on/off ratio represents the change in field at the position of the sensor when the sensor is near the surface of a highly permeable material. If the ratio is high, then it is easier for the rest of the system to sense the reader is near the surface of a highly permeable material. Furthermore, having a high ratio increases the signal to noise ratio.

Based on the foregoing it can be appreciated that the invention describes an apparatus, system, and method for probing the magnetic permeability of a material are described herein. Generally, the invention provides a sensor unit 100 that further comprises a plurality of magnetic layers thereof, including a first soft ferromagnetic layer 104, a second soft ferromagnetic layer 109, a first hard ferromagnetic layer 102 and a second hard ferromagnetic layer 106; an intermediate layer 103 separating the first hard ferromagnetic layer 102 from the first soft ferromagnetic layer 104; an insulating layer 108 separating the first soft ferromagnetic layer 104 from the second soft ferromagnetic layer 109; and a spacer layer 105 separating the second soft ferromagnetic layer 109 from the second hard ferromagnetic layer 106, wherein the second soft ferromagnetic layer 109 is dimensioned and configured to have a thickness greater than the first soft ferromagnetic layer 104, and wherein the sensor unit 100 measures the magnetic permeability of a material 101 located a distance D from the sensor unit 100 through the magnetic interaction of the magnetic layers 102, 104, 106, 109 of the sensor unit 100. Additionally, the invention provides a bridging ferromagnet layer 107 for facilitating magnetic flux lines traveling through the first and second soft ferromagnetic layers 104, 109.

The first soft ferromagnetic layer 104 and the second soft ferromagnetic layer 109 may comprise a same material. Alternatively, it may be advantageous to use different soft ferrromagnets instead. Moreover, the second soft ferromagnetic layer 109 increases an on/off ratio of a magnetic field in the first soft ferromagnetic layer 104, wherein the on/off ratio is approximately 1.6. Additionally, the second soft ferromagnetic layer 109 pulls a magnetic field of the sensor unit 100 (or system) into the first soft ferromagnetic layer 104. The intermediate layer 103 comprises an insulator or a conductor. The conduction between the first hard ferromagnetic layer 102 and the first soft ferromagnetic layer 104 occurs via tunneling if the intermediate layer is an insulator. Alternatively, the conduction occurs via in-plane conduction if the intermediate layer is a conductor.

Furthermore, the thickness of the spacer layer 105 and the thickness of the second hard ferromagnetic layer 106 are respectively greater than the thickness of the intermediate layer 103 and the thickness of the first hard ferromagnetic layer 102. Moreover, a magnetic interaction occurs between the second hard ferromagnetic layer 106 and the second soft ferromagnetic layer 109, if the distance D is approximately equal to a thickness of the spacer layer 105. A change in magnetization of the first soft ferromagnetic layer 104 results in a change in impedance between the first hard ferromagnetic layer 102 and the first soft ferromagnetic layer 104 or the in-plane conductance depending upon whether the intermediate layer is an insulator or a conductor. Also, the sensor unit 100 is moveable in at least one direction proximate to the material for probing thereof, wherein a length L of the first hard ferromagnetic layer 102, the second hard ferromagnetic layer 106, the first soft ferromagnetic layer 104, the second soft ferromagnetic layer 109, the intermediate layer 103, the insulating layer 108, and the spacer layer 105 is comparable to the length over which the sensor unit 100 probes the magnetic permeability of material 101 located the distance D from the sensor unit 100, and wherein the length L is approximately 10 to 100 microns.

Several advantages are afforded by varying embodiments of the invention. The device described herein, including systems and methods thereof, can be adapted to probe the magnetic permeability of magnetic surface layers that include magnetic recording media. The length over which one probes the material utilizing the sensor unit described herein can be varied. Adding the bridging ferromagnetic layer 107 can increase the sensitivity of the device.

Because the device described herein can be implemented as a miniature magnetic sensor a number of applications are available for sensing the local magnetic permeability in a variety of materials, it lends itself to a variety of uses including industrial, biomedical, oceanographic, environmental, military, and space related applications, to name a few. For example, the local probe of magnetic properties provided by the invention can be used to read non-erasable magnetic media on credit cards, 1D tags, etc. This is a great advantage since it is easy to lose valuable information when standard magnetic media are exposed to a magnetic field.

The non-erasable media would also be radiation hard. There is great need to be able to store and retrieve information using radiation hard media on satellites. The trend in magnetic sensor design and development is constantly evolving toward smaller size, lower power consumption and lower cost for similar performance. Thus, the device described herein, including systems and methods thereof, is ideally suited for use with magnetic sensing applications, including MEMS-type components. Generally, the invention allows a more practical use of GMR sensors and SDT sensors in a local probe of magnetic properties. Furthermore, the hard ferromagnets may comprise of several layers one of which pins the direction of the magnetization of the ferromagnet. As such, the invention addresses the need to be able to store information in radiation hard media for satellites and other space applications.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. An apparatus for probing magnetic permeability of a material located a distance from said apparatus, said apparatus comprising:
    a first hard ferromagnetic layer;
    a second hard ferromagnetic layer;
    a first soft ferromagnetic layer;
    a second soft ferromagnetic layer;
    an intermediate layer disposed between said first hard ferromagnetic layer and said first soft ferromagnetic layer;
    an insulating layer between said first soft ferromagnetic layer and second soft ferromagnetic layer; and
    a spacer layer disposed between said second soft ferromagnetic layer and said second hard ferromagnetic layer.

2. The apparatus of claim 1, wherein said first soft ferromagnetic layer and said second soft ferromagnetic layer comprise a same material.

3. The apparatus of claim 1, wherein said second soft ferromagnetic layer increases an on/off ratio of a magnetic field in said first soft ferromagnetic layer.

4. The apparatus of claim 3, wherein said on/off ratio is approximately 1.6.

5. The apparatus of claim 1, wherein said second soft ferromagnetic layer pulls a magnetic field of said apparatus into said first soft ferromagnetic layer.

6. The apparatus of claim 1, wherein said intermediate layer comprises an insulator.

7. The apparatus of claim 1, wherein said intermediate layer comprises a conductor.

8. The apparatus of claim 1, wherein conduction between said first hard ferromagnetic layer and said first soft ferromagnetic layer occurs via tunneling.

9. The apparatus of claim 1, wherein conduction in said first hard ferromagnetic layer, said first soft ferromagnetic layer, and conducting intermediate layer occurs via in-plane conduction.

10. The apparatus of claim 1, wherein a thickness of said spacer layer and a thickness of said second hard ferromagnetic layer are respectively greater than a thickness of said intermediate layer, a thickness of said first hard ferromagnetic layer, and a thickness of said second soft ferromagnetic layer.

11. The apparatus of claim 1, wherein a magnetic interaction occurs between said second hard ferromagnetic layer and said second soft ferromagnetic layer, if said distance is approximately equal to a thickness of said spacer layer.

12. The apparatus of claim 1, wherein a change in magnetization of said first soft ferromagnetic layer results in a change in impedance between said first hard ferromagnetic layer and said first soft ferromagnetic layer.

13. The apparatus of claim 1, wherein a change in magnetization of said first soft ferromagnetic layer results in a change in in-plane conduction in said first hard ferromagnetic layer, said first soft ferromagnetic layer, and said intermediate layer.

14. The apparatus of claim 1, wherein said apparatus is moveable in at least one direction proximate to said material for probing thereof.

15. The apparatus of claim 1, wherein a length L of said apparatus is greater than an average size of a probed feature in said material located said distance from said apparatus.

16. The apparatus of claim 15, wherein said length L is approximately 10 to 100 microns.

17. The apparatus of claim 1, further comprising a bridging ferromagnet layer for facilitating magnetic flux lines traveling from said second hard ferromagnetic layer to the first and second soft ferromagnetic layers.

18. A system for probing the magnetic permeability of a material, said system comprising:
    a sensor unit that comprises a plurality of magnetic layers thereof, including a first soft ferromagnetic layer, a second soft ferromagnetic layer, a first hard ferromagnetic layer and a second hard ferromagnetic layer;
    an intermediate layer separating said first hard ferromagnetic layer from said first soft ferromagnetic layer;
    an insulating layer separating said first soft ferromagnetic layer from second soft ferromagnetic layer; and
    a spacer layer separating said second soft ferromagnetic layer from said second hard ferromagnetic layer,
    wherein said second soft ferromagnetic layer is dimensioned and configured to have a thickness greater than said first soft ferromagnetic layer, and
    wherein said sensor unit measures the magnetic permeability of a material located a distance from said sensor unit through the magnetic interaction of said magnetic layers of said sensor unit.

19. The system of claim 18, wherein said first soft ferromagnetic layer and said second soft ferromagnetic layer comprise a same material.

20. The system of claim 18, wherein said second soft ferromagnetic layer increases an on/off ratio of a magnetic field in said first soft ferromagnetic layer.

21. The system of claim 20, wherein said on/off ratio is approximately 1.6.

22. The system of claim 18, wherein said second soft ferromagnetic layer pulls a magnetic field of said system into said first soft ferromagnetic layer.

23. The system of claim 18, wherein said intermediate layer comprises an insulator.

24. The system of claim 18, wherein said intermediate layer comprises a conductor.

25. The system of claim 18, wherein conduction between said first hard ferromagnetic layer and said first soft ferromagnetic layer occurs via tunneling.

26. The system of claim 18, wherein conduction between said first hard ferromagnetic layer said first soft ferromagnetic layer occurs via in-plane conduction.

27. The system of claim 18, wherein a thickness of said spacer layer and a thickness of said second hard ferromagnetic layer are respectively greater than a thickness of said intermediate layer, a thickness of said first hard ferromagnetic layer, and a thickness of said second soft ferromagnetic layer.

28. The system of claim 18, wherein a magnetic interaction occurs between said second hard ferromagnetic layer and said second soft ferromagnetic layer, if said distance is approximately equal to a thickness of said spacer layer.

29. The system of claim 18, wherein a change in magnetization of said first soft ferromagnetic layer results in a change in impedance between said first hard ferromagnetic layer and said first soft ferromagnetic layer.

30. The system of claim 18, wherein a change in magnetization of said first soft ferromagnetic layer results in a change in in-plane conduction in said first hard ferromagnetic layer, said first soft ferromagnetic layer, and said intermediate layer.

31. The system of claim 18, wherein said sensor unit is moveable in at least one direction proximate to said material for probing thereof.

32. The system of claim 18, wherein a length L of said apparatus is greater than an average size of a probed feature in said material located said distance from said apparatus.

33. The system of claim 32, wherein said length L is approximately 10 to 100 microns.

34. The system of claim 18, further comprising a bridging ferromagnet layer for facilitating magnetic flux lines traveling from said second hard ferromagnetic layer to the first and second soft ferromagnetic layers.

35. A method for probing the magnetic permeability of a material, said method comprising:
configuring a sensor unit to comprise magnetic layers thereof, including a first soft ferromagnetic layer, a second soft ferromagnetic layer, a first hard ferromagnetic layer and a second hard ferromagnetic layer;
disposing an intermediate layer between said first hard ferromagnetic layer and said first soft ferromagnetic layer within said sensor unit;
positioning an insulating layer between said first soft ferromagnetic layer and said second soft ferromagnetic layer;
positioning a spacer layer between said second soft ferromagnetic layer and said second hard ferromagnetic layer; and
measuring the magnetic permeability of a material located a distance from said sensor unit through a magnetic interaction of said magnetic layers of said sensor unit.

36. The method of claim 35, wherein said second soft ferromagnetic layer increases an on/off ratio of a magnetic field in said first soft ferromagnetic layer.

37. The method of claim 35, wherein said second soft ferromagnetic layer pulls a magnetic field of said system into said first soft ferromagnetic layer.

38. The method of claim 35, further comprising configuring a thickness of said spacer layer and a thickness of said second hard ferromagnetic layer to be respectively greater than a thickness of said intermediate layer, a thickness of said first hard ferromagnetic layer, and a thickness of said second soft ferromagnetic layer.

39. The method of claim 35, wherein a magnetic interaction occurs between said second hard ferromagnetic layer and said second soft ferromagnetic layer, if said distance is approximately equal to a thickness of said spacer layer.

40. The method of claim 35, wherein a change in magnetization of said first soft ferromagnetic layer results in a change in impedance between said first hard ferromagnetic layer and said first soft ferromagnetic layer.

41. The method of claim 35, wherein a change in magnetization of said first soft ferromagnetic layer results in a change in in-plane conduction in said first hard ferromagnetic layer, said first soft ferromagnetic layer, and said intermediate layer.

42. The method of claim 35, further comprising configuring a bridging ferromagnet layer for facilitating magnetic flux lines from said second hard ferromagnetic layer to the first and second soft ferromagnetic layers.

* * * * *